US010916804B2

(12) United States Patent
Porthault et al.

(10) Patent No.: US 10,916,804 B2
(45) Date of Patent: Feb. 9, 2021

(54) METHOD FOR FABRICATING AN ELECTROCHEMICAL DEVICE AND ELECTROCHEMICAL DEVICE

(71) Applicant: COMMISSARIAT À L'ENERGIE ATOMIQUE ET AUX ENERGIES ALTERNATIVES, Paris (FR)

(72) Inventors: Hélène Porthault, Echirolles (FR); Marie-Josephe Armel, Poitiers (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 154 days.

(21) Appl. No.: 16/333,824

(22) PCT Filed: Sep. 18, 2017

(86) PCT No.: PCT/FR2017/052493
§ 371 (c)(1),
(2) Date: Mar. 15, 2019

(87) PCT Pub. No.: WO2018/051044
PCT Pub. Date: Mar. 22, 2018

(65) Prior Publication Data
US 2019/0260076 A1 Aug. 22, 2019

(30) Foreign Application Priority Data
Sep. 19, 2016 (FR) ..................... 16 58777

(51) Int. Cl.
*H01M 10/0565* (2010.01)
*H01M 10/0525* (2010.01)
*H01M 4/133* (2010.01)
*H01M 2/16* (2006.01)
*H01M 6/18* (2006.01)
*H01M 4/131* (2010.01)
*H01M 10/052* (2010.01)
*H01L 31/00* (2006.01)
*H01M 6/40* (2006.01)
*H01M 10/04* (2006.01)
*H01M 10/054* (2010.01)
*G02F 1/1523* (2019.01)
*H01M 6/22* (2006.01)

(52) U.S. Cl.
CPC ........ *H01M 10/0565* (2013.01); *H01L 31/00* (2013.01); *H01M 2/1686* (2013.01); *H01M 4/131* (2013.01); *H01M 4/133* (2013.01); *H01M 6/181* (2013.01); *H01M 6/40* (2013.01); *H01M 10/052* (2013.01); *H01M 10/0525* (2013.01); *G02F 1/1525* (2013.01); *H01M 6/22* (2013.01); *H01M 10/054* (2013.01); *H01M 2010/0495* (2013.01); *H01M 2300/0085* (2013.01)

(58) Field of Classification Search
CPC .. H01M 10/0565; H01M 10/052; H01M 6/40; H01M 2/1686; H01M 4/131; H01M 4/133; H01M 6/181; H01M 10/0525; H01M 2300/0085; H01M 2010/0495; H01M 10/054; H01M 6/22; H01L 31/00; G02F 1/1525; Y02E 60/10
See application file for complete search history.

(56) References Cited

U.S. PATENT DOCUMENTS

| | | | | |
|---|---|---|---|---|
| 5,426,005 A * | 6/1995 | Eschbach | .......... | H01M 10/0565 429/309 |
| 5,665,490 A * | 9/1997 | Takeuchi | ........... | C08G 18/4837 429/314 |
| 5,780,160 A * | 7/1998 | Allemand | ........... | G02F 1/15165 428/426 |
| 7,097,943 B2 | 8/2006 | Cho et al. | | |
| 2005/0221194 A1 | 10/2005 | Cho et al. | | |
| 2014/0272190 A1* | 9/2014 | Huang | ................ | H01M 4/1391 427/554 |
| 2015/0072245 A1* | 3/2015 | Yu | ......................... | H01M 4/139 429/303 |
| 2015/0349310 A1* | 12/2015 | Viner | .................... | H01M 4/134 429/126 |

FOREIGN PATENT DOCUMENTS

| | | |
|---|---|---|
| EP | 1 278 260 A1 | 1/2003 |
| EP | 2 879 224 A1 | 6/2015 |
| KR | 10-2013-0025078 A | 3/2013 |
| KR | 101339704 B1 | 12/2013 |
| WO | 00/25378 A1 | 5/2000 |

OTHER PUBLICATIONS

Bella, Frederico et al., "Photoinduced Polymerization: An Innovative, Powerful and Environmentally Friendly Technique for the Preparation of Polymer Electrolytes for Dye-Sensitized Solar Cells", Journal of Photochemistry and Photobiology C: Photochemistry Reviews, vol. 16, (2013), pp. 1-21.
Nov. 14, 2017 Search Report issued in International Patent Application No. PCT/FR2017/052493.

* cited by examiner

*Primary Examiner* — Muhammad S Siddiquee
(74) *Attorney, Agent, or Firm* — Oliff PLC

(57) ABSTRACT

A method for fabricating the electrochemical device includes provision of a first stack. This first stack successively includes: a first electrode, an electrically insulating liquid electrolyte in contact with the first electrode, a second electrode separated from the first electrode by the liquid electrolyte. The method includes an at least partial polymerisation step of the liquid electrolyte.

15 Claims, 6 Drawing Sheets

METHOD FOR FABRICATING AN ELECTROCHEMICAL DEVICE AND ELECTROCHEMICAL DEVICE

FIELD OF THE INVENTION

The invention relates to a method for fabricating an electrochemical device and in particular a microbattery or an electrochrome device.

The invention also relates to an electrochemical device.

STATE OF THE ART

Microbatteries are defined as being electrochemical generators formed by a stack of thin layers comprising at least two (positive and negative) electrodes separated by an electrolyte. These microbatteries in particular enable power sources to be tailored to accommodate the new mobile applications that are regularly proposed and integrate electronic microcircuits.

A large number of electrochemical devices, and in particular batteries, use an electrolyte in liquid form. This electrolyte is composed of a solvent associated with a metallic salt. This electrolyte presents a high conductivity, greater than $10^{-3}$ S/cm, which makes it particularly advantageous. However, devices using a liquid electrolyte are subjected to stringent safety constraints as the risk of leakage of the electrolyte is far from being negligible.

It is known to use solid electrolytes that are fabricated by means of polymers. These electrolytes are totally solid and use a metallic salt associated with a polymer or inorganic matrix. These electrolytes do not contain any solvents. They are characterised by a good mechanical strength and by a low ionic conductivity, typically less than $10^{-6}$ S/cm. As the electrolyte is in solid form, there is no risk of leakage.

It is also known to use polymer-gel electrolytes. These electrolytes also use a polymer or inorganic matrix that is used to confine a liquid. This liquid is a mixture of a solvent with a metallic salt. The polymer matrix provides the mechanical properties and the liquid phase provides the electrochemical properties. Such an electrolyte presents improved electrochemical performances in comparison with a totally solid electrolyte made from polymers. However, the electrochemical performances and in particular the ionic conductivity are not as good as those of a liquid electrolyte. It is also apparent that implementation is more complicated.

Work is ongoing to improve the performances of electrolytes and in the form of gels. This work relates for example to improvement of the mechanical performances as shown in the document U.S. Pat. No. 7,097,943. This document propose to produce different mixtures of polymer materials that are subjected to a polymerisation step by ultraviolet radiation. On completion of this polymerisation, a metallic salt is added before the battery is sealed.

Work can also relate to improvement of the electrochemical performances by adding for example polar or apolar functions and/or by adding hydrophilic and/or hydrophobic functions on the active material. Such a teaching is shown in the document EP 2,879,224. This document also discloses that the positive and negative electrodes are formed and that a separator is subsequently added to form a lithium battery.

OBJECT OF THE INVENTION

One object of the invention is to provide a method for fabricating an electrochemical device that is easy to implement and that enables a device with improved performances to be produced.

The method for fabricating the electrochemical device comprises:
  providing a first stack successively comprising:
    a first electrode,
    an electrically insulating and ionically conducting electrolyte in contact with the first electrode, the electrolyte being in liquid or gel form,
    a second electrode in contact with the electrolyte and separated from the first electrode by the electrolyte.
  The method is remarkable in that it comprises a polymerisation step of at least a part of the electrolyte by means of electromagnetic radiation through the first electrode and/or the second electrode, the first electrode and/or second electrode being textured to define at least a first region and a second region having different transmission rates of said electromagnetic radiation and/or at least one salient pattern.

In a development, the polymerisation step is configured to define at least a first area having a first degree of cross-linking and a first cross-linking density and a second area having a second degree of cross-linking different from the first degree of cross-linking and/or a second cross-linking density different from the first cross-linking density by means of the first region and second region.

In preferential manner, the salient pattern possesses an apex and at least one side wall covered by the electrolyte before the polymerisation step.

More particularly, the apex and the at least one side wall are covered by the electrolyte in solid form after the polymerisation step.

In an advantageous embodiment, the electrochemical device is a battery or an electrochrome device. The first electrode comprises:
  a first support substrate,
  a first current collector covering the first support substrate,
  a first electrochemically active layer in electric contact with the first current collector.
The electrolyte is in contact with the first electrochemically active layer.
The second electrode comprises:
  a second electrochemically active layer separated from the first electrochemically active layer by the electrolyte,
  a second current collector in contact with the second electrochemically active layer, the second current collector being separated from the first current collector at least by the electrolyte,
  a second support substrate.

In another development, the first area and second area are defined by differences of thickness of the first electrochemically active layer and/or of the first current collector.

In an alternative embodiment, the polymerisation step defines an alternation of first areas and second areas in a direction parallel to a main surface of the first electrode.

In advantageous manner, the polymerisation step is configured to form preferential ionic conduction areas connecting the first electrode with the second electrode, the ionic conduction areas being formed by first areas surrounded by a continuous second area.

In an advantageous embodiment, the interface between the first area and the second area is in the extension of the interface between an area where the first electrochemically active layer covers the support substrate and an area where the first electrochemically active layer leaves the support substrate uncovered.

It is advantageous to provide for the first support substrate to be transparent to the first radiation and for the first electrochemically active layer and the first current collector to be opaque to the first radiation and to be configured to define gaps where the first area comes into contact with the first support substrate.

Preferentially, the polymerisation step is a complete polymerisation step transforming a liquid electrolyte into an electrolyte comprising first and second areas in solid or gel form.

In one development, the polymerisation step comprises exposure of the electrolyte by means of a first radiation passing only through the first electrode to the electrolyte.

It is advantageous to provide for the polymerisation step to comprise a first exposure of the electrolyte by means of a first radiation passing through the first electrode to the electrolyte and a second exposure step of the liquid electrolyte by means of the first radiation passing through the second electrode to the electrolyte.

In advantageous manner, the polymerisation step comprises a first exposure of the electrolyte by means of a first radiation passing through the first electrode to the electrolyte and by means of a second radiation passing through the second electrode to the electrolyte, the two radiations being applied simultaneously.

In a particular embodiment, the method comprises the use of a blocker connecting the first electrode with the second electrode and configured to form an electrolyte reservoir in association with the first electrode and the second electrode before the polymerisation step.

It is a further object of the invention to provide an electrochemical device that presents better performances than devices of the prior art.

The electrochemical device is remarkable in that it comprises a first electrode and a second electrode separated by an electrically insulating electrolyte. The electrolyte comprises at least a first area having a first degree of cross-linking and a first cross-linking density and a second area having a second degree of cross-linking different from the first degree of cross-linking and/or a second cross-linking density different from the first cross-linking density.

It is also advantageous to provide for the electrolyte to be bi-phase and to comprise a second area in solid phase or in gel form defining channels filled by a first area in liquid phase, the liquid phase being formed by a first mixture comprising monomers and/or pre-polymers and the solid or gel phase being formed by the first mixture in which the monomers and/or pre-polymers have reacted to form polymers.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
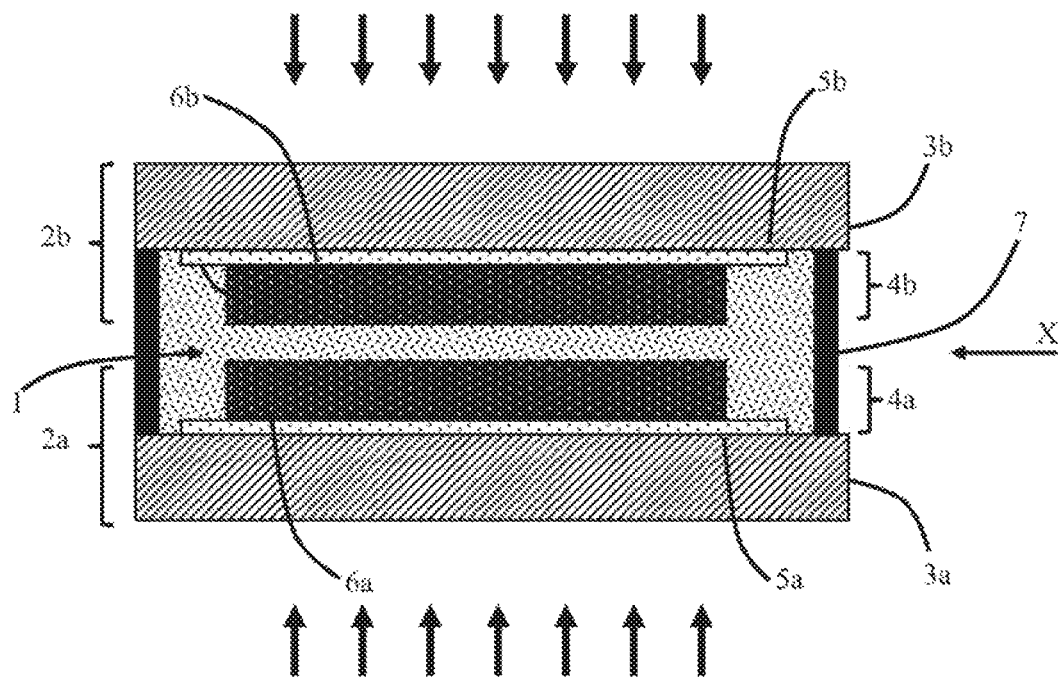
FIGS. 1 and 2 represent, in schematic manner, a first embodiment of a method for fabricating an electrochemical device, in cross-section.

The electrochemical device comprises an electrolyte 1 that physically and electrically separates first and second electrodes 2a and 2b. The first and second electrodes 2a and 2b are distinct and electrically conducting. In advantageous manner, the first and second electrodes 2a and 2b are electrochemically active with the electrolyte 1 and participate in migration of an ion between the first and second electrodes 2a and 2b.

Depending on the embodiments, the electrochemical device can for example be a battery, an electrochrome device or a capacitor.

At least one of the first and second electrodes 2a and 2b performs the mechanical support of the electrochemical device. In one embodiment, the first electrode 2a performs the support function and the second electrode 2b acts as cover to seal off the electrochemical device. In an alternative embodiment, the first electrode 2a and second electrode 2b both perform the support function.

In advantageous manner, the first and second electrodes 2a and 2b present barrier characteristics. Preferably, in the case of a battery or an electro-chrome device, the first and second electrodes 2a and 2b form a diffusion barrier against external pollutants, for example $O_2$ or $H_2O$.

In a first particular embodiment, the first and/or second electrodes 2a and 2b are fabricated exclusively from electrically conducting materials. The first electrode 2a and second electrode 2b can be made from identical or different materials. The first electrode 2a and second electrode 2b can be made entirely from a metal. The metal can be a pure element or a metal alloy. The pure element or the constituents of the alloy can be chosen from the following elements: aluminium, copper, nickel, titanium, silver, gold, chromium, tungsten, tantalum, barium and platinum. It is also possible to fabricate the first electrode 2a and/or second electrode 2b from an alloy containing at least one or two of the foregoing materials. The metal alloy can also be a stainless steel or an alloy containing a large quantity of nickel alloyed with iron and chromium. This alloy can also contain secondary elements chosen from niobium, molybdenum or manganese. This alloy can be marketed under the tradename Inconel®. It is further possible to provide for the first electrode 2a and/or second electrode 2b to be made from a transparent conducting oxide, for example from indium tin oxide alloy (ITO).

For example, the first electrode 2a and/or second electrode 2b can be a foil made from a material chosen from: aluminium, copper, nickel, titanium, silver, gold, chromium, tungsten or platinum. It is also possible to fabricate the first electrode 2a and/or second electrode 2b from an alloy containing at least two of the aforesaid materials.

The first electrode 2a and/or second electrode 2b can have flat or three-dimensional main surfaces, i.e. that comprise salient and/or recessed areas. The flat or three-dimensional main surfaces are the two surfaces facing one another and in contact with the electrolyte 1.

In an alternative embodiment, the first and/or second electrodes 2a and 2b are formed by stacks of several different layers. These stacks advantageously comprise a first support substrate 3a and a second support substrate 3b made from electrically insulating material. The first support substrate 3a and second support substrate 3b are respectively covered by a first electrically conducting layer 4a and a second electrically conducting layer 4b.

In a particular embodiment, the first support substrate 3a and/or second support substrate 3b can be made from identical or different materials. The support substrate 3a/3b can for example be made from silicon, glass, mica, silicate, quartz, ceramic material and/or plastic material. It is advantageous to fabricate the support substrate 3a/3b from a plastic material chosen from the polyimide which can be sold under the tradename Kapton® or polyethylene terephtalate which can be sold under the tradename Mylar®.

The first electrically conducting layer 4a and/or second electrically conducting layer 4b can be made from identical or different materials. The electrically conducting layer 4a/4b can be made from one of the aforesaid electrically conducting materials to form the electrodes 2a/2b.

In an advantageous embodiment, the first electrically conducting layer 4a and/or second electrically conducting layer 4b respectively comprise a first current collector 5a covered by a first electrochemically active layer 6a and a second current collector 5b covered by a second electrochemically active layer 6b.

The first electrochemically active layer 6a and/or second electrochemically active layer 6b advantageously present common electrochemical properties with the electrolyte 1.

The current collector 5a/5b is made from a material conducting electric current. The current collector 5a/5b can be made from any one of the different materials proposed to form the electrodes 2a/2b. The first current collector 5a can be made from a material that is identical to or different from that of the second current collector 5b. In advantageous manner, the current collector is made from metal and comprises an atomic percentage of at least 90% of one of the aforesaid metals. It is also possible to fabricate the current collectors from a metal alloy containing one or more of the aforesaid materials.

The first electrochemically active layer 6a and second electrochemically active layer 6b can be made from identical or different materials. It is advantageous to use the first electrochemically active layer 6a and/or second electrochemically active layer 6b to form a battery or an electrochrome device.

The first electrochemically active layer 6a or the second electrochemically active layer 6b forms a positive electrode. The positive electrode is a cation insertion electrode to insert for example $Na^+$ or $Li^+$. To form the positive electrode, it is possible to use lithium intercalation materials and for example those of the LiMO group and more particularly: $LiCoO_2$, $LiFeO_2$, $LiMn_2O_4$, $Li_{0.33}Mn_2O_4$ and more generally materials of $LiM_xMn_{2-x}O_4$ type with $0 \leq x \leq 0.5$ and M=Ni, Co, Fe, Ti etc. It is further possible to fabricate the positive electrode from a material chosen from $LiCoPO_4$, $LiFePO_4$, $Li_4Ti_5O_{12}$, or LiTiOS.

The same can be the case for sodium and in general manner for the ion used in operation of the electrochrome device or of the battery.

The other electrochemically active layer 6b or 6a is a negative electrode. The material used to form the negative electrode depends on the type of battery involved, i.e. on the type of electrolyte 1 used. The battery can be a lithium-metal battery with a lithium-metal electrode.

The negative electrode can also be of lithium-ion type with materials able to form an alloy or a defined compound with lithium. The materials forming the electrochemically active layer 6a/6b are advantageously chosen from the list composed of Bi, Sb, Si, Sn, Zn, Ni, Cd, Ce, Co, Fe, Mg, and Ge. It is also possible to choose oxides of $M_xO_y$ type or sulphides of $M_xS_y$ type with M representing a metal. It is further possible to fabricate the electrode by means of a complex of MF or MF2 type with M representing a metal and F representing fluorine.

It is further possible to fabricate a battery of lithium-free type, i.e. devoid of any metal lithium. In this case, one of the electrochemically active layers 6a or 6b is present. The negative electrode can be made from a non-electrochemically active material, for example from a material able to form a current collector, for example copper. The same can be the case for sodium-based batteries.

This embodiment is particularly advantageous when the first and/or second current collectors 5a and 5b do not present any electrochemical properties and/or are not electrochemically active, and is even more advantageous when the first and/or second current collectors 5a and 5b present a better electric conductivity than the first or second electrochemically active layers 6a or 6b.

As an alternative, it is also possible to fabricate the electrically conducting layer 4a/4b from a material presenting electrochemical properties and/or being electrochemically active and chosen from the aforesaid materials to form the layers 6a/6b.

These properties are particularly desirable for formation of a microbattery and of an electrochrome device.

As indicated in the foregoing, the electrolyte layer 1 separates the two electrodes 2a and 2b and, more precisely, the electrolyte layer 1 separates the first and second support substrates 3a and 3b and the first and second electrically conducting layers 4a and 4b.

In certain embodiments, it is also provided for the electrolyte layer 1 to separate the first and second current collectors 5a and 5b and the first and second electrochemically active layers 6a and 6b.

In order to produce a more rugged electrochemical device, it is particularly advantageous to use an electrolyte 1 that is at least partially in the form of a solid or a gel thereby enabling risks of leakage to be limited. However, the use of an electrolyte in solid or gel form generally results in a more complex fabrication method having to be implemented.

In order to ensure a good contact between the electrodes 2a and 2b, the electrolyte 1 is initially in liquid or gel form which enables it to adjust to the different morphologies of the surface of the electrode 2a/2b. When the electrode comprises gaps and/or a porous material, the use of a liquid electrolyte or an electrolyte in the form of an advantageously low-viscosity gel enables the latter to penetrate into the gaps, for example the pores of the electrode. This enables good impregnation of each of the electrodes with electrolyte 1 to be ensured. This configuration is particularly advantageous when at least one of the electrodes 2a/2b is three-dimensional, i.e. comprising a salient part. The electrolyte can then infiltrate into the anfractuosities of the material, which is not the case with a solid or highly viscous electrolyte.

The electrolyte 1 is configured to be able to be polymerised thereby increasing its degree of cross-linking and/or its cross-linking density. The electrolyte 1 can be transformed into a solid or a gel electrolyte. A polymerisation step is performed while the electrolyte 1 is in contact with the first electrode 2a and with the second electrode 2b. In this way, the polymerised electrolyte will remain perfectly in contact with the two electrodes 2a and 2b. This embodiment is preferable to an embodiment where the electrolyte is already cross-linked before being connected with the second electrode 2b. As the electrolyte is malleable, it can deform to partially compensate fabrication uncertainties and to ensure a perfect contact with the electrodes 2a and 2b before being polymerised.

This solution is particularly advantageous when fabricating a battery or an electrochemical device comprising a current collector that is capped by an electrochemically active layer. The different layers formed define three-dimensional patterns. For example, the apex and the lateral surfaces are in close contact with the electrolyte before and after polymerisation which improves the electrical performances by increasing the contact surface between the electrolyte 1 and electrode 2a/2b.

An electrolyte in liquid form is an electrolyte that is able to flow, that presents a weak cohesion between its molecules and that is easily deformable.

An electrolyte in gel form is an electrolyte that does not flow but that remains deformable. It can however deform under its own weight.

An electrolyte in solid form is an electrolyte that does not flow and that cannot deform without breaking. It presents a strong cohesion between its molecules.

Transformation by polymerisation into a more rigid electrolyte, for example a solid electrolyte or an electrolyte in gel form, can be achieved in different manners.

In particularly advantageous manner, polymerisation of the electrolyte 1 is obtained by means of exposure with an electromagnetic radiation, preferably an ultraviolet radiation.

The document KR 10-1339704 discloses polymerisation of a liquid electrolyte in a solar panel in order to ensure conduction of the current between the photoelectrode and the counter-electrode. A substantially equivalent teaching is presented in the publication by Bella et al. ("Photoinduced polymerization: An innovative, powerful and environmentally friendly technique for the preparation of polymer electrolyte for dye sensitive solar cell" Journal of Photochemistry and Photobiology C: Photochemistry reviews 16(2013) 1-21).

The document EP 1,278,260 describes fabrication of a fuel cell that includes a bonding step of two electrolytic membranes by hot pressing followed by a polymerisation step by ultraviolet radiation to reduce the cohesion with the support layer and to free access to the electrolytic membrane.

As an alternative, it is possible to combine polymerisation by the electromagnetic radiation with polymerisation by evaporation of a solvent present in the electrolyte 1. It is also possible to obtain polymerisation by heating the electrolyte 1 above the polymerisation temperature of the monomer precursors present in the electrolyte. In advantageous manner, the electrolyte is heated to a temperature of more than 150° C.

It is advantageous to use an electromagnetic radiation for example to transform the electrolyte 1 into a more rigid electrolyte. This does in fact avoid having to heat the electrochemical device which could result in damage to certain of its constituents. This also prevents formation of an electrochemical device that is permeable to the solvent as this embodiment can be complicated to implement as far as the choice of materials is concerned.

The electrolyte 1 is configured to be an electronic insulator and preferentially an ionic conductor in solid or gel form. The electrolyte is advantageously configured to be an electronic insulator and preferentially an ionic conductor in liquid form.

The electrolyte 1 is advantageously formed by a polymer or inorganic matrix that provides its structural properties and by a liquid that provides its electrical and electrochemical properties.

In advantageous manner, the matrix is formed by a material comprising pores filled with a liquid solution comprising at least one salt of the ion to be transported between the electrodes 2a and 2b. The ion used can for example be lithium or sodium depending on the type of battery required. As a variant, it is also possible to provide for the ion to be able to be chosen from potassium, silver, copper, magnesium and aluminium.

The electrolyte advantageously contains a matrix and for example a polymer matrix that can be formed by a material chosen from polyethylene glycol (PEG), bisphenol A ethoxylate dimethacrylate (BEMA), polyethylene glycol diacrylate, methyl methacrylate (MMA), polyvinylidene fluoride (PVDF), polymethyl methacrylate (PMMA), polyacrylonitrile (PAN), or polyvinylidene fluoride-hexafluoropropylene (PVDF-HFP, polyvinylidene fluoride-co-hexafluoropropylene)).

It is further possible to use a polyionic liquid to form the matrix. For example, it is advantageous to use (poly(N-vinylimidazolium) bis(trifluoromethanesulphonylim ide)).

It is further possible to use an inorganic matrix of silica type which is advantageously chosen from tetraethyl orthosilicate (TEOS), methyl trimethoxysilane (NTMS), tetramethyl orthosilicate (TMOS), vinyl triethoxysilane (TEVOS) or a mixture of the latter.

The electrolyte 1 can also contain a solvent and advantageously a carbonate solvent and more advantageously a solvent chosen from ethylene carbonate (EC), propylene carbonate (PC), diethyl carbonate (DEC), dimethyl carbonate (DMC), succinonitrile (SN) glutaronitrile (GN), or vinyl carbonate (VC). The electrolyte 1 can also contain a mixture of several of the aforesaid solvents.

The electrolyte 1 can also contain an ionic liquid which is preferentially chosen from ionic liquids in the family including piperidinium, imidazolium, pyrrolidinium and pyridinium anions or ammonium anions. These ionic liquids are advantageously associated with at least one of the cations of CH3COO-acetate, bis(trifluoromethanesulphonyl)imide TFSI-, bis(fluorosulphonyl)imide FSI-, bis(oxalate)borate B(O4C2)2-, bromide Br-, chloride Cl-, iodide I-, tetrachloroaluminate Cl-:AlCl2, hexafluorophosphate PF6-, tetrafluoroborate BF4-, dicyanamide N(CN)2-, ethylphosphonate (C2H5O)(H)PO2-, methylphosphonate (CH3O)(H)PO2-, hydrogen sulphate HSO4-, methanesulphonate CH3SO3-, and/or trifluoromethanesulphonate CF3SO3-. The electrolyte 1 can also contain a mixture of several of the aforesaid ionic liquids with one or more of the aforesaid cations.

As a variant, it is further possible to form an electrolyte 1 that contains at least one of the aforesaid solvents and at least one of the aforesaid ionic liquids.

To form a lithium battery, the electrolyte 1 advantageously contains a lithium salt chosen from lithium chloride (LiCl), lithium bromide (LiBr), lithium iodide (Lip, lithium perchlorate (LiClO$_4$), lithium hexafluorophosphate (LiPF$_6$), lithium bis(fluorosulphonyl)imide (LiFSI), lithium tetrafluoroborate (LiBF$_4$), lithium hexafluoro arsenate (LiAsF$_6$), lithium bis(trifluoro methanesulphonyl)imide (LiTFSI), lithium bis(trifluoro methanesulphonyl)imide or a mixture of several of these salts.

In the same way, to form a sodium battery, the electrolyte 1 contains a sodium salt.

To perform polymerisation by means of an electromagnetic radiation and more particularly by means of an ultraviolet radiation, it is advantageous to add a photoinitiator to the electrolyte 1. The photoinitiator is advantageously chosen from 2-hydroxy-2-methyl-1-1-phenylpopane-1-one (marketed under the tradename Darocur™ 1173 or HMPP), azobisisobutyronitrile (AIBN), 2-2-dimethoxy-2-phenylacetophenone (DMPA), benzophenone (BP), or p-xylene-bis (n,n-diethyl dithiocarbonate) (XDT).

By judiciously choosing the constituents of the electrolyte 1 and in particular the photoinitiator, it is possible to define the radiation wavelength that enables the electrolyte 1 to be polymerised.

For example purposes, an electrolyte 1 containing a polymer matrix of BEMA type and a photoinitiator of HMPP type is reactive to a wavelength equal to 365 nm. It is advantageous to use a radiation power comprised between 3 and 40 mW/cm$^2$ and a dose that can range from 0.2 to 0.5 mWh/cm$^2$ to perform polymerisation. The person skilled in the art should bear in mind that the dose and exposure power can vary in order to take account of the required physicochemical parameters and in particular to obtain specific mechanical, electrochemical and chemical properties.

In the configuration illustrated in FIG. 1, the electrolyte 1 is situated between the electrodes 2a and 2b. The electrolyte is located by means of the first and second electrodes 2a and 2b. Depending on its viscosity, the electrolyte 1 can be located by means of a blocker 7, here in the form of a ring that is in contact with the first electrode 2a and with the second electrode 2b, so as to completely or partially define a cavity filled by the electrolyte 1 preferentially in liquid or low-viscosity gel form. In particularly advantageous manner, the cavity is completely filled by the electrolyte 1. The electrolyte 1 is in contact with the first electrode 2a and with the second electrode 2b. The blocker 7 in the form of a ring advantageously defines a waterproof enclosure preferentially with respect to the pressure of the external atmosphere in cooperation with the first electrode 2a and with the second electrode 2b.

If the electrolyte is in the form of a viscous gel or in solid form, the blocker 7 surrounding the liquid electrolyte is not necessary. As a variant, the blocker 7 can be replaced by multiple non-contiguous side walls which limit flow of the liquid electrolyte 1 from the area involved until polymerisation of the electrolyte has been completed.

Once polymerisation has been completed, the blocker 7 can be removed. As an alternative, the blocker can be kept if it enables ingress of pollutants or harmful molecules, for example oxygen and water, to be blocked or delayed.

In an advantageous embodiment, spacers (not shown) are arranged between the first electrode 2a and second electrode 2b. These spacers enable the minimum distance separating the two electrodes 2a and 2b to be defined. It is advantageous to use spacers to act as blocker 7 and to locate the electrolyte 1 at the surface of the electrodes 2a and 2b. In advantageous manner, the spacer is configured so that the minimum distance between the first electrode 2a and second electrode 2b is less than 500 microns. In a particular embodiment where the electrochemical device is a battery or an electrochrome device, the spacer is configured so that the distance between the two electrochemically active layers 6a and 6b is less than or equal to 50 microns. This precaution prevents short-circuiting between the two electrodes 2a and 2b while at the same time ensuring that a small distance is obtained between the electrodes.

Figure 2:
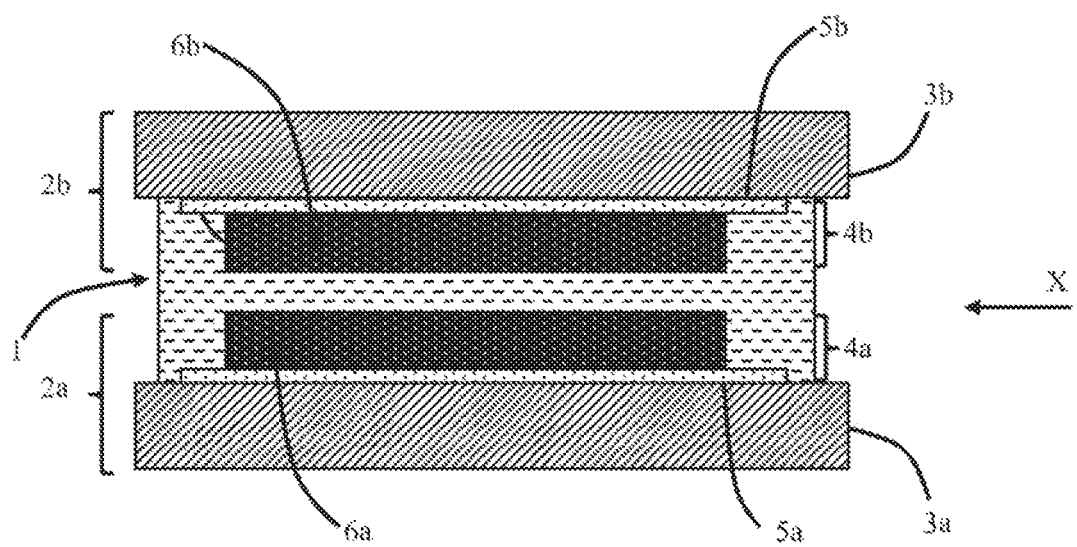

In one embodiment, the polymerisation step is a step of at least partial polymerisation of the electrolyte 1 by exposure of the electrolyte 1 by means of a first electromagnetic radiation through the first and/or second electrodes 2a/2b. The device undergoes a polymerisation step of the electrolyte 1. The electrolyte 1 will therefore react so as to be at least partially transformed into a more rigid electrolyte, for example a solid electrolyte or an electrolyte in gel form. FIG. 2 represents a total polymerisation of the electrolyte. The spacers 7 have been removed.

Before the polymerisation step, the electrolyte 1 is formed by a first mixture containing monomers and/or pre-polymers. After the polymerisation step, the electrolyte is formed by the first mixture in which the monomers and/or pre-polymers have reacted to form polymers. The chemical composition is therefore the same with the exception of the polymerisation reaction of the monomers and/or pre-polymers.

The polymerisation step is performed by irradiation through at least one of the electrodes 2a/2b of the electrochemical device. This electrode 2a/2b is an active element of the electrochemical device.

At least one of the electrodes is textured, i.e. it presents differences of thicknesses and/or of composition. It is particularly advantageous to use this texturing to form areas with different transmission rates of the electromagnetic radiation. For example, this texturing is used to form at least one opaque area and at least one transparent area.

For example, the difference of transmission rates can be defined by the presence or absence of the layer 4 or of the layer 5 and/or by differences of thickness in the support 2.

What is meant by transparent to the electromagnetic radiation is advantageously that less than 50% of the incident radiation is absorbed by the first electrode 2a or by the second electrode 2b between the two opposite surfaces of the electrode.

In a first embodiment, the electrolyte 1 is initially in liquid form. When the polymerisation step is performed, the whole volume of the electrolyte 1 is transformed. It is advantageous to transform the liquid electrolyte into a solid electrolyte in order to eliminate risks of leakage. As an alternative, it is advantageous to transform the liquid electrolyte into an electrolyte in gel form in order to eliminate risks of leakage.

In a second embodiment, the electrolyte is initially in gel form. When the polymerisation step is performed, the whole volume of the electrolyte 1 is transformed. It is advantageous to transform the electrolyte in gel form into a solid electrolyte in order to eliminate risks of leakage in case of serious damage. As an alternative, it is advantageous to transform the electrolyte in gel form into an electrolyte also in the form of a gel, but much less viscous, in order to reduce risks of leakage.

It is particularly advantageous to provide for the polymerisation step to form a first area 1α and a second area 1β that present different cross-linking characteristics. Depending on the specific cases, the first area 1α and second area 1β are both a solid electrolyte or an electrolyte in gel form.

These cross-linking differences result in differences of mechanical, chemical and electrochemical behaviour, for example differences of ionic conductivity.

The inventors in particular observed that for equivalent irradiation doses, a low power and a long exposure time are favourable for obtaining good ionic conduction properties whereas a high power and a shorter exposure time are favourable for obtaining a good mechanical strength of the matrix of the polymerised electrolyte.

In an alternative embodiment, the electrolyte 1 comprises a first area 1α in solid form and a second area 1β in gel form or vice versa.

It is particularly advantageous to provide for the exposure angle to be variable so as to expose the whole volume of electrolyte 1 thereby forming an electrolyte in solid and/or in gel form and possibly areas 1α and 1β.

It is advantageous to use different exposure conditions and in particular exposure conditions with different angles (between the incident radiation and at the surface of the electrochemical device) in order to modify the proportion of the first area 1α and of the second area 1β with respect to what is initially defined for example by means of a mask formed by the differences of transmission rates of the electrode 2a/2b. In the case of an electrolyte initially in liquid state, the use of different exposure angles enables the liquid phase proportion to be reduced.

In a specific case, the second electrode 2b can be opaque to the radiation used.

In an alternative embodiment, the liquid electrolyte 1 is totally transformed into a solid electrolyte and/or an electrolyte in gel form by performing a first polymerisation step through the first electrode 2a and a second polymerisation step through the second electrode 2b. The two electrodes 2a/2b present portions transparent to the radiation used and opaque portions. Exposure through the first electrode 2a and exposure through the second electrode 2b can be performed successively or simultaneously.

In a first particular case, the exposure step is performed by means of a radiation that is applied with a fixed angle with respect to the electrochemical device. This angle can be defined as the angle that exists between the surface of the electrochemical device and the propagation direction of the radiation. As an alternative, exposures at variable angles can be used.

It is particularly advantageous to provide for the sum of the opaque areas of the two electrodes to be smaller than the surface of an electrode and for the opaque areas of the two electrodes to be offset from one another along the irradiation axis in order to facilitate transformation of the whole of the electrolyte.

It is advantageous to form an electrolyte 1 that has uniform ionic and mechanical properties from the interface with the first electrode 2a up to the interface with the second electrode 2b. It is also possible to provide for the electrolyte 1 to have uniform or different ionic and mechanical properties from one end up to the opposite end in a direction parallel to the interface between the electrolyte and one of the electrodes.

In another advantageous embodiment illustrated in FIGS. 3 to 10, the exposure step is configured to apply different exposure conditions, i.e. two different radiation powers and/or two different doses on two distinct areas of the electrolyte 1. These two different exposure conditions will result in two different polymerisation reactions on the electrolyte which will form a first area 1α and second area 1β presenting different cross-linking characteristics.

In one embodiment, it is possible to use a mask presenting at least two regions that have different electromagnetic radiation transmission rates.

These differences in the transmission rate are used to form the first and second areas 1α and 1β of the electrolyte. This embodiment is particularly advantageous as it enables the shape of the areas to be modified rapidly by simply changing the shape of the first and second regions of the mask.

As illustrated in FIGS. 3 to 10, the mask is an inner mask that forms part of the electrochemical device. The mask can be formed in the first electrode 2a and/or in the second electrode 2b. The mask is used to define the first area 1α and second area 1β. It is particularly advantageous to form the mask in the electrodes 2a and/or 2b as the first and second areas 1α and 1β are self-aligned with respect to the patterns of the electrode which facilitates location of areas with improved mechanical performances and areas with improved ionic performances.

In an embodiment that can be illustrated in FIGS. 3 to 10, the mask is partially transparent to the electromagnetic radiation, i.e. it has opaque areas and areas transparent to the electromagnetic radiation. In a specific case, all the transparent areas have the same transmission rate. In an alternative, several different transmission rates can be present among the different transparent areas.

In an alternative embodiment, the polymerisation step is configured to expose the first area 1α and to expose the second area 1β of the electrolyte. Cross-linking will take place in the second area 1β and in the first area 1α. The exposure conditions of the first area 1α are different from the exposure conditions of the second area 1β.

In another embodiment that can also be illustrated in FIGS. 3 to 10, the mask is transparent to the electromagnetic radiation, i.e. it has at least first and second areas transparent to the electromagnetic radiation. These first and second transparent areas present different transmission rates.

In a particular embodiment illustrated in FIGS. 3 to 10, the mask presents an alternation of first areas and second areas in a direction X parallel to the main surface of the first electrode 2a and/or of the second electrode 2b.

In the embodiment illustrated in FIGS. 3 to 10, the central region of the first electrode 2a presents a lower transmission rate than the peripheral region as it is thicker and/or is formed from a more absorbent material. For example, the central region is opaque.

The exposure step defines the first area 1α and second area 1β. In advantageous manner, the second area 1β completely surrounds the first area 1α. In this way, if the first area 1α is liquid, the risks of leakage of the liquid electrolyte are reduced without the electrochemical performances of the device being impaired.

A configuration with opaque areas and transparent areas can be used to partially transform the liquid electrolyte 1 into a solid electrolyte. The device then comprises a bi-phase electrolyte. The portion of liquid electrolyte 1 that was transformed into solid or gel electrolyte enables the risks of leakage of the liquid electrolyte 1 to be reduced. Areas of liquid electrolyte are kept to enhance the ionic performances of the electrolyte.

In yet another alternative embodiment, a first polymerisation step is performed through the first electrode 2a and a second polymerisation step is performed through the second electrode 2b. This specific case can be advantageous to reduce the proportion of the material in liquid phase. In general manner, the conditions of the second exposure step can be identical to or different from the conditions of the first exposure step, for example as far as the power and the direction of the electromagnetic radiation are concerned.

It is advantageous to provide for a solid electrolyte to be polymerised on the peripheral areas in contact with the first electrode 2a and with the second electrode 2b which enables the risks of leakage of the liquid electrolyte 1 to be reduced.

The different alternative embodiments can be used either alone or in combination to form the first and second areas. It is possible to use an outer mask in association with an inner mask and possibly a radiation source delivering different powers simultaneously. It is further possible to use an inner mask either alone or in association with an outer mask and possibly a radiation source delivering different powers simultaneously. It is further possible to use a radiation source delivering different powers simultaneously either alone or in association with an outer mask and/or an inner mask.

In a particular embodiment, the differences of optical properties of the first electrode 2a are defined by fabricating a first electrode using different materials and/or different material thicknesses. The first and second regions are advantageously defined by means of differences of thickness of the electrochemically active layer 6a and/or of the first current collector 5a.

In a first embodiment, the first electrode 2a is formed by a first support substrate 3a successively covered by a first current collector 5a and by a first electrochemically active layer 6a.

The electrochemically active layer 6a can present areas with different thicknesses in order to define first regions and second regions in the first electrode 2a. As a variant, the electrochemically active layer 6a can be etched in order to define covered areas and uncovered areas at the surface of the current collector 5a, thereby defining first regions and second regions in the first electrode 2a. It is particularly advantageous to provide for the proportion of transparent areas to be less than 50% and preferentially less than 10%. Limiting the surface of etched area of the electrochemically active layer 6a enables a large quantity of active material to be kept in operation of the battery or of the electrochrome device.

As an alternative, the current collector 5a can present areas with different thicknesses in order to define first regions and second regions in the mask formed in the first electrode 2a. As a variant, the current collector 5a can be etched in order to define covered areas and uncovered areas at the surface of the support substrate 3a thereby defining first regions and second regions in the first electrode 2a. The electrochemically active layer 6a comes into contact with the support substrate 3a in the areas not covered by the current collector 5a.

In another alternative embodiment, the electrochemically active layer 6a and current collector 5a both present areas with different thicknesses thereby enabling first regions and second regions to be defined in the first electrode 2a. It is also possible to etch the stack formed by the electrochemically active layer 6a and current collector 5a so as to define covered areas and uncovered areas at the surface of the support substrate 3a thereby defining first regions and second regions in the first electrode 2a. The electrolyte 1 comes into contact with the support substrate 3a in the areas not covered by the electrochemically active layer 6a and not covered by the current collector 5a.

In the embodiment illustrated in FIGS. 3 to 10, the electrochemically active layer 6a and current collector 5a both define holes so as to let the incident radiation pass and so that all the areas of the current collector 5a are connected to one another and at the same potential. As an alternative, the current collector is not etched, i.e. it is continuous.

Figure 3:
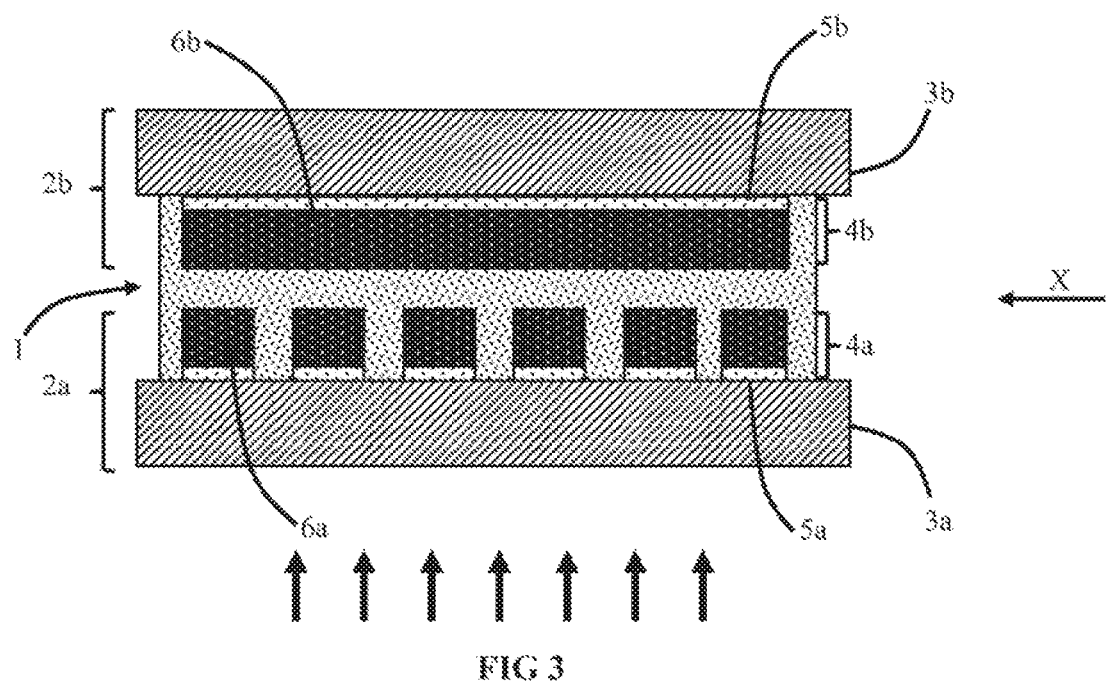
FIGS. 3 and 4 represent, in schematic manner, two alternative embodiments of a method for fabricating an electrochemical device, in cross-section.
Figure 4:
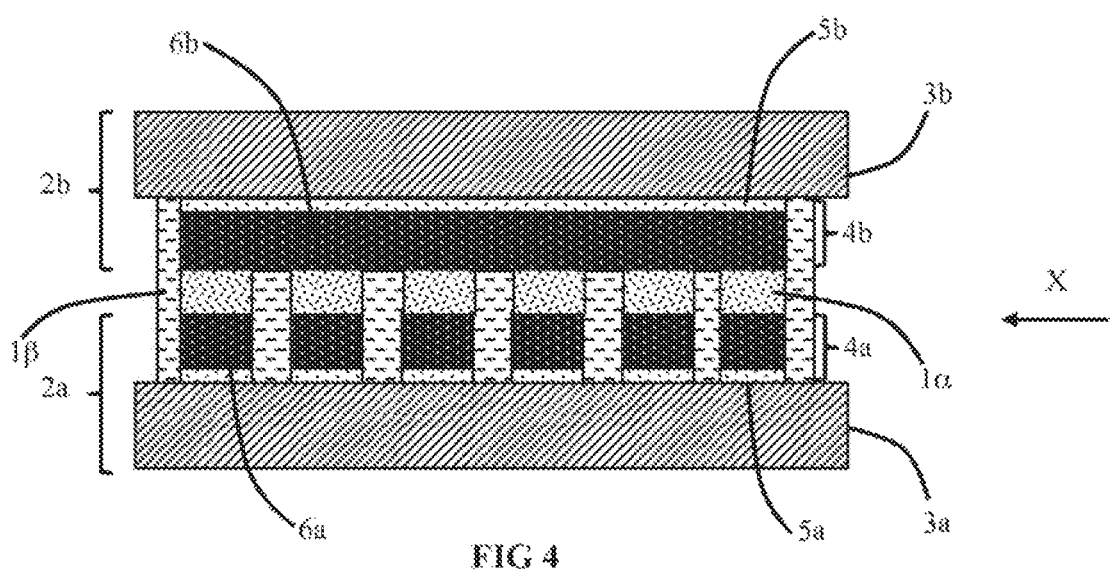

In the embodiment illustrated in FIGS. 3 and 4, the first electrode 2a presents first regions and second regions. The first areas 1α preferentially made from liquid electrolyte and the second areas 1β preferentially made from solid electrolyte are defined by the shape of the first regions and of the second regions with respect to the direction of the incident radiation through the first electrode 2a. FIG. 3 illustrates a device before polymerisation and FIG. 4 illustrates the same device after polymerisation. The device comprises several areas made from the electrically conducting layers 4a that define areas opaque to the incident radiation and an area made from electrically conducting layer that is opaque to the incident radiation.

In the embodiment illustrated in FIGS. 5 to 10, the first electrode 2a and second electrode 2b both present opaque areas and transparent areas. The first areas 1α preferentially made from liquid electrolyte and the second areas 1β preferentially made from solid electrolyte will be defined by the intersections between the shape of the first regions and of the second regions in the two electrodes with respect to the direction of the incident radiation in the course of the two exposures steps. If a single exposure step is performed, transformation of the liquid electrolyte 1 into a solid electrolyte takes place in the same way as for the embodiment illustrated in FIGS. 3 and 4.

Figure 5:
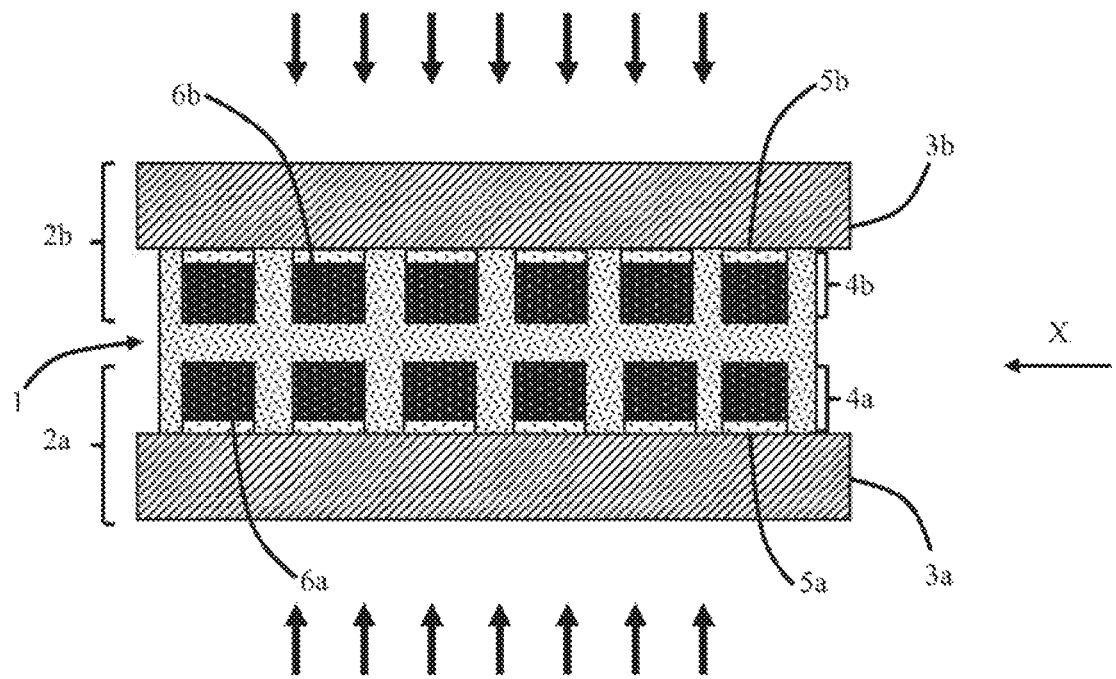
FIGS. 5 and 6 represent, in schematic manner, another alternative embodiment of a method for fabricating an electrochemical device, in cross-section.
Figure 6:
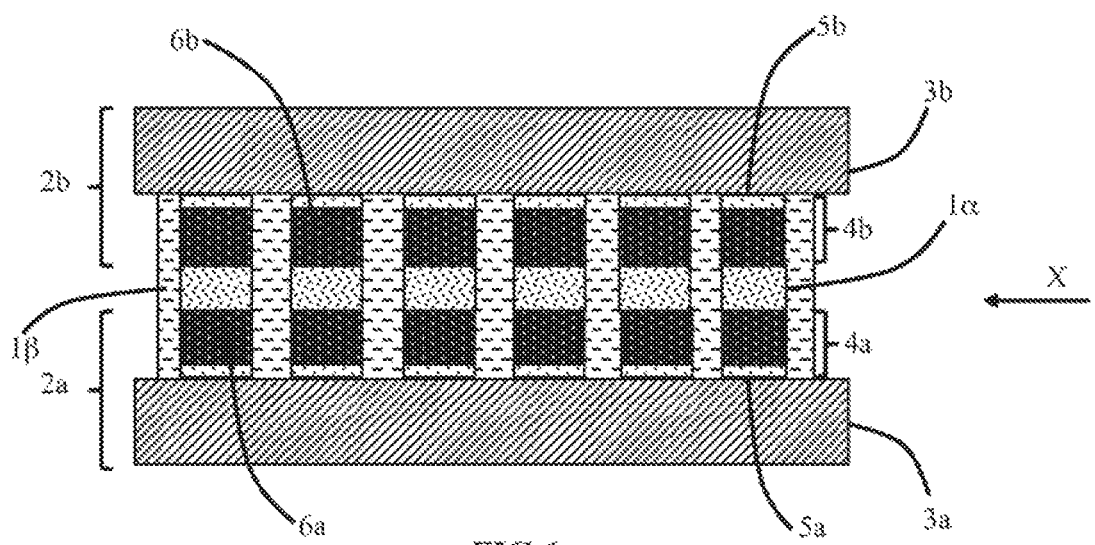

In a first exemplary case illustrated in FIGS. 5 and 6, the first regions of the first electrode 2a and the first regions of the second electrode 2b are aligned along the axis of propagation of the electromagnetic radiation. In this way, a first area 1 can be formed in the extension of two first regions facing one another and between the two first regions. This first area 1 comes into contact with the two electrodes 2a and 2b. FIG. 5 illustrates a device before polymerisation and FIG. 6 illustrates the same device after polymerisation.

It is also advantageous to provide for the second regions of the first electrode 2a and the second regions of the second electrode 2b to also be aligned along the axis of propagation of the electromagnetic radiation. In this way, a second area can be formed and this second area comes into contact with the two electrodes 2a and 2b.

Figure 7:
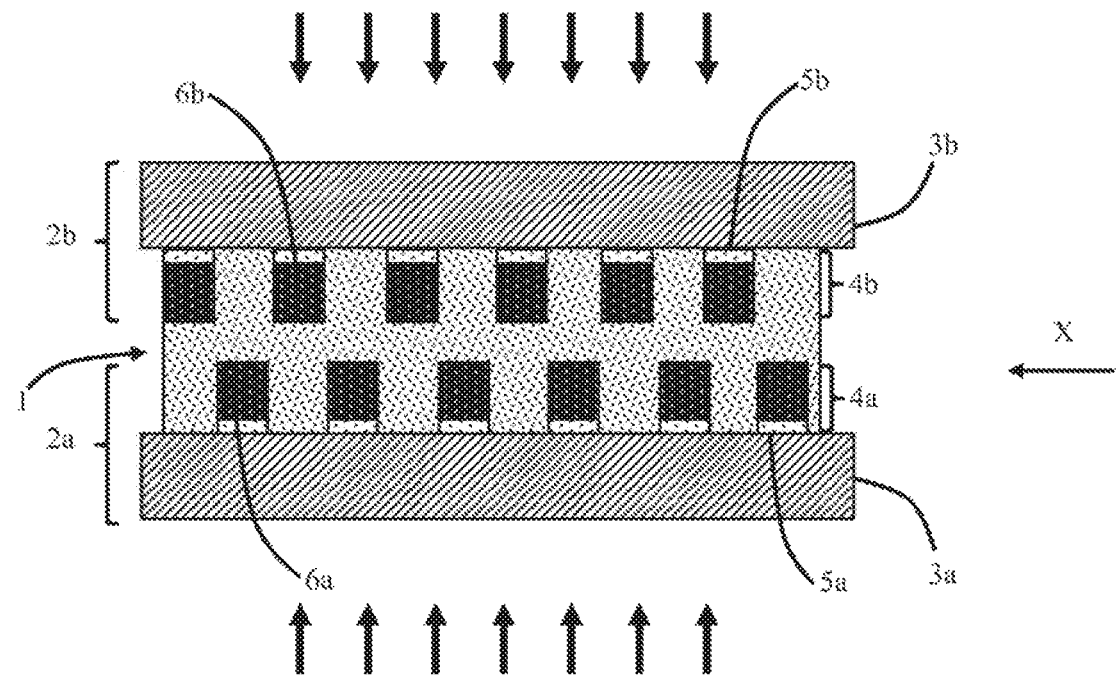
FIGS. 7 and 8 represent, in schematic manner, another embodiment of a method for fabricating an electrochemical device, in cross-section.
Figure 8:
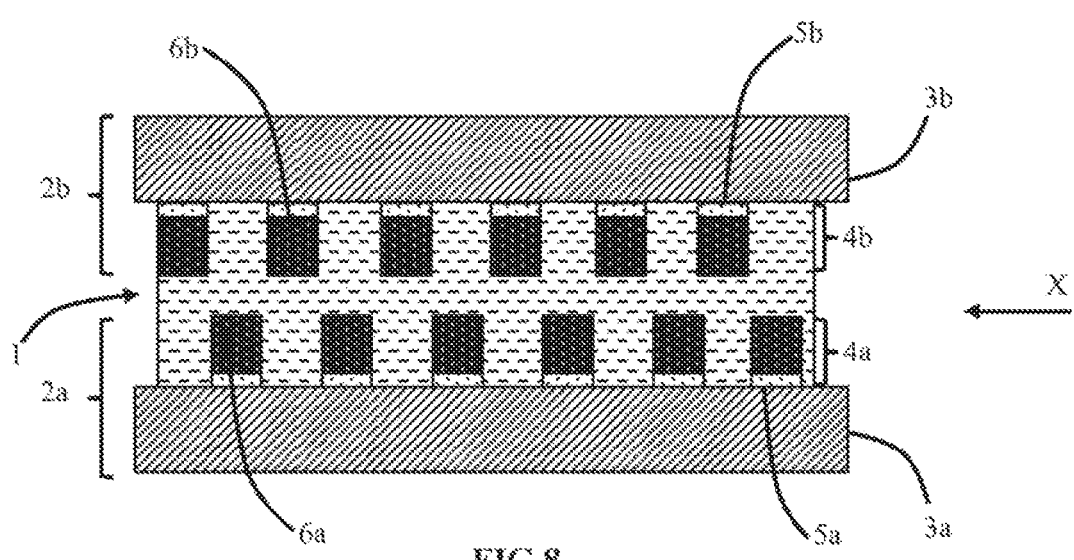

In a second exemplary case illustrated in FIGS. 7 and 8, the first regions of the first electrode 2a and the first regions of the second electrode 2b are not aligned along the axis of propagation of the electromagnetic radiation in case of single exposure or of double exposure on each side of the electrochemical device.

This embodiment is particularly advantageous to totally transform a liquid electrolyte 1 into a solid electrolyte or an electrolyte in gel form. It is also advantageous to provide for the first regions of the first electrode 2a and the second regions of the second electrode 2b to also not be aligned along the axis of propagation of the electromagnetic radiation. It is thereby easier to obtain a totally solid electrolyte or an electrolyte in gel form.

In the embodiment illustrated in FIGS. 7 and 8, the first region of the first electrode 2a is facing a second region of the second electrode 2b along the axis of propagation of the electromagnetic radiation. It is also provided for a second region of the first electrode 2a to be facing a first region of the second electrode 2b along the axis of propagation of the electromagnetic radiation. In this way, it is easier to obtain a totally solid electrolyte 1.

Figure 9:
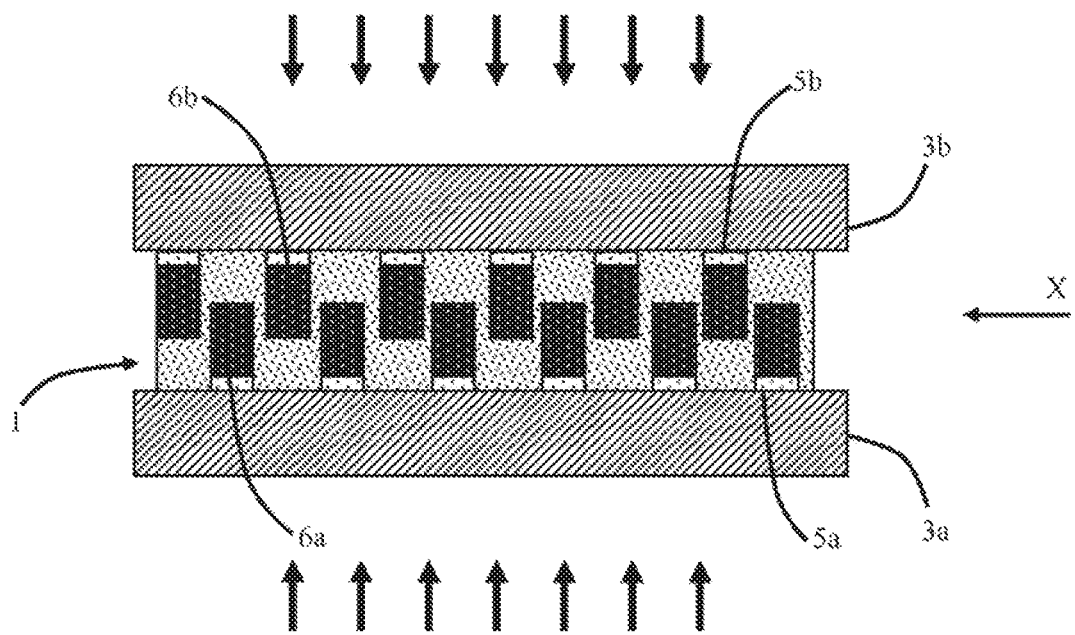
FIGS. 9 and 10 represent, in schematic manner, yet another embodiment of a method for fabricating an electrochemical device, in cross-section.
Figure 10:
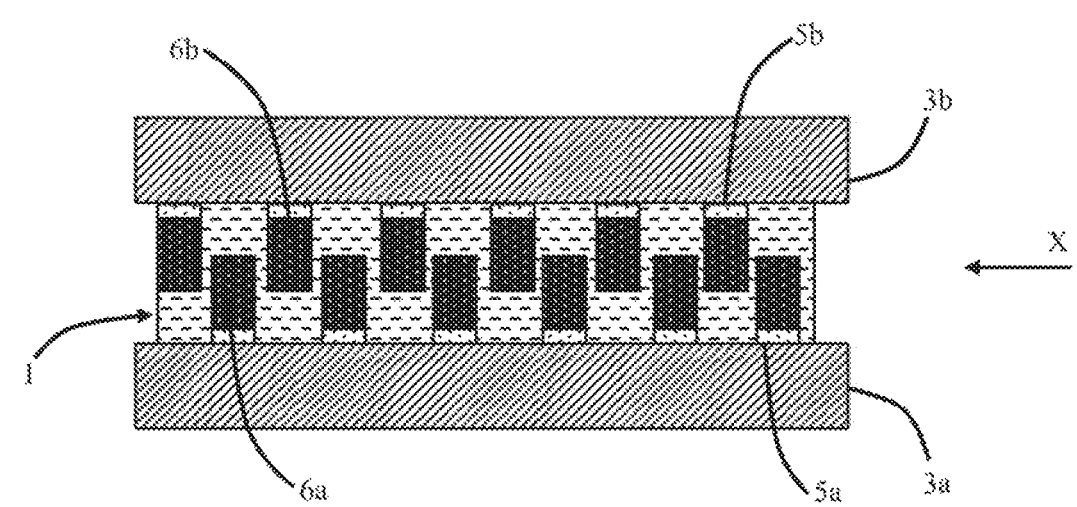

In a particularly advantageous embodiment illustrated in FIGS. 9 and 10, the first and second electrochemically active layers 6a and 6b define three-dimensional structures which are intercalated between one another.

Figure 11:
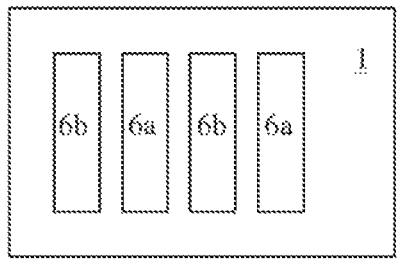
FIGS. 11, 12 and 13 represent, in schematic manner, different arrangements of the electrodes in relation with FIGS. 9 and 10, in top view.
Figure 12:
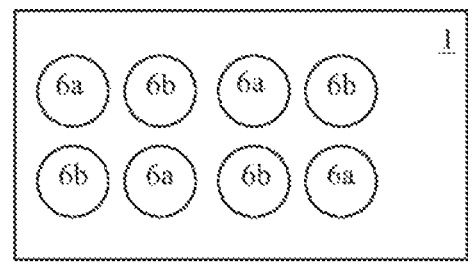
Figure 13:
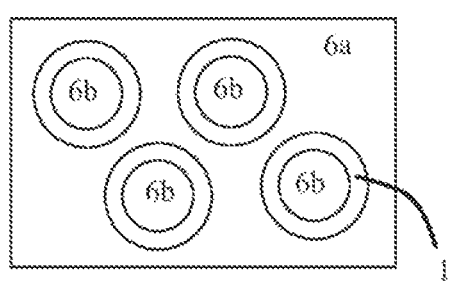

The first and second electrochemically active layers 6a and 6b are arranged so as to come to face one another in a direction X parallel to the main surface of the first electrode 2a. The first and second electrochemically active layers 6a and 6b can be patterned to define pillars as illustrated in FIGS. 11 and 12, or they can be patterned so as to define two shapes fitting with one another, for example two complementary shapes as illustrated in FIG. 13. A space is provided between the shapes defined by the first electrochemically active layer 6a and the shapes defined by the second electrochemically active layer 6b in order to be able to confine the electrolyte 1.

These methods are particularly advantageous to form an electrochemical device comprising a first electrode 2a and a second electrode 2b separated by an electrically insulating electrolyte 1.

The electrolyte 1 comprises at least a first area 1α having a first degree of cross-linking and a first cross-linking density and a second area 1β having a second degree of cross-linking different from the first degree of cross-linking and/or a second cross-linking density different from the first cross-linking density.

In one embodiment, the electrolyte 1 can be bi-phase. The second area is a solid or gel phase which defines channels filled by a liquid phase 1 formed by the first area. The liquid phase 1 is formed by a first mixture containing monomers and/or pre-polymers. The solid or gel phase is formed by the first mixture and, in this first mixture, the monomers and/or pre-polymers have reacted to form polymers.

As an alternative, the electrolyte 1 can be single-phase and comprise two areas in solid or gel phase with different properties. The second area defines channels filled by the first area 1α. The first area 1α is formed by a first mixture presenting a first degree of cross-linking. The second area 1β is formed by the first mixture in a second degree of cross-linking different from the first degree of cross-linking. The first area 1α presents a better ionic conductivity than the second area 1β. The second area 1β presents a greater strength than the first area 1α.

In this particular configuration, the electrolyte layer separates the first electrode 2a and second electrode 2b in three-dimensional manner, i.e. in three directions orthogonal to one another.

In this embodiment, total polymerisation of the electrode enables an assembly to be formed with two particularly compact three-dimensional electrodes without deterioration of the polymer when the electrode is inserted in the electrolyte 1.

The first stack can be formed simply in the following manner. The first electrode 2a is provided and the electrolyte 1 is deposited on the first electrode 2a. If necessary, the blocker 7 can be used to confine the electrolyte.

When the second electrode 2b is placed in contact with the electrolyte, the latter can overflow beyond the blocker 7 so as to ensure a perfect contact between the electrolyte 1 and the two electrodes 2a/2b.

The second stack can be formed simply in the following manner by providing the second electrode 2b.

The second electrode 2b is placed in contact with the electrolyte 1 which separates the two electrodes 2a and 2b. The electrochemical device is formed.

The assembly undergoes a polymerisation step in order to partially or totally transform the electrolyte 1. The general shape of the electrochemical device, and therefore the shape of the electrolyte, is defined before the polymerisation step. In this way, the shape taken by the polymerised electrolyte is exactly that of the electrodes 2a and 2b. This embodiment can be used for example to form a capacitor.

This embodiment can also be used to form a more complex device such as a battery or an electrochrome device. The first electrode 2a is for example formed by providing a support substrate 3a on which a first current collector 5a is formed. It is then possible to form a first electrochemically active layer 6a on the first current collector 5a.

Depending on the embodiments, the different layers forming the first electrode can be deposited full wafer and then etched. As an alternative, the different layers can be formed through a mask so as to directly define the required patterns. It is also possible to combine these two techniques according to the layers to be deposited. As in the above, once the first electrode has been formed, the electrolyte 1 can be deposited. In this case, the electrolyte is deposited in contact with the electrochemically active layer. Here again, a blocker 7 can be used.

The second electrode 2b can be formed in similar manner to the first electrode. The second electrode 2b, and more particularly the second electrochemically active layer 6b, is placed in contact with the electrolyte 1. When contact is made, the electrolyte 1 deforms and/or overflows beyond the blocker 7.

As before, a polymerisation step is performed so as to at least partially transform the electrolyte 1 into an electrolyte in solid or gel form.

The invention claimed is:

1. Method for fabricating an electrochemical device comprising:
    providing a first stack successively comprising:
        a first electrode,
        an electrolyte in contact with the first electrode, the electrolyte being electrically insulating and ionically conducting and being in liquid or gel form,
        a second electrode in contact with the electrolyte and separated from the first electrode by the electrolyte,
    applying an electromagnetic radiation to at least a partially polymerise the electrolyte, the electromagnetic radiation being applied to the electrolyte through the first electrode or the second electrode, and
    wherein the first electrode or second electrode is textured to define at least a first region and a second region having different transmission rates of said electromagnetic radiation or defining at least a salient pattern penetrating into the electrolyte.

2. Method for fabricating an electrochemical device according to claim 1, wherein the electromagnetic radiation and the first electrode or the second electrode define at least a first area and a second area in the electrolyte and wherein the first area has a first degree of cross-linking and a first cross-linking density and the second area has a second degree of cross-linking different from the first degree of cross-linking or a second cross-linking density different from the first cross-linking density.

3. Method for fabricating an electrochemical device according to claim 1, wherein the salient pattern has an apex and at least one side wall in contact with the electrolyte before applying the electromagnetic radiation.

4. Method for fabricating an electrochemical device according to claim 3, wherein the apex and the at least one side wall are in contact with the electrolyte in solid form after applying the electromagnetic radiation.

5. Method for fabricating an electrochemical device according to claim 1, wherein
    the electrochemical device is a battery or an electrochrome device,
    the first electrode comprises:
        a first support substrate,
        a first current collector covering the first support substrate,
        a first electrochemically active layer in electric contact with the first current collector,
    the electrolyte is in contact with the first electrochemically active layer, and the second electrode comprises
- a second electrochemically active layer separated from the first electrochemically active layer by the electrolyte,
- a second current collector in contact with the second electrochemically active layer, the second current collector being separated from the first current collector at least by the electrolyte,
- a second support substrate.

6. Method for fabricating an electrochemical device according to claim 5, wherein the first electrochemically active layer or the first current collector presents regions having different thicknesses to define different transmission rates of said electromagnetic radiation thicknesses being measured along a transmission direction of the electromagnetic radiation.

7. Method for fabricating an electrochemical device according to claim 2, wherein applying electromagnetic radiation through the first electrode or the second electrode defines an alternation of first areas and second areas along a direction parallel to a main surface of the first electrode contacting the electrolyte.

8. Method for fabricating an electrochemical device according to claim 2, wherein applying electromagnetic radiation through the first electrode or the second electrode defines a plurality of first areas surrounded by a continuous second area, the first areas connecting the first electrode to the second electrode and the first areas having an ionic conduction greater than an ionic conduction of the second area, the first areas having a first degree of cross-linking and a first cross-linking density and the continuous second area having a second degree of cross-linking different from the first degree of cross-linking or a second cross-linking density different from the first cross-linking density.

9. Method for fabricating an electrochemical device according to claim 5, wherein the electromagnetic radiation and the first electrode or the second electrode define a first area and a second area in the electrolyte, the electromagnetic radiation being applied along a transmission direction, and wherein an interface between the first area and the second area is in the extension of an interface between an area where the first electrochemically active layer covers the first support substrate and an area where the first electrochemically active layer leaves the first support substrate uncovered along the transmission direction.

10. Method for fabricating an electrochemical device according to claim 5, wherein the first support substrate is transparent to the electromagnetic radiation and wherein the first electrochemically active layer and the first current collector are opaque to the electromagnetic radiation and are configured to define gaps where the first area comes into contact with the first support substrate.

11. Method for fabricating an electrochemical device according to claim 1, wherein, before applying the electromagnetic radiation, the electrolyte is a liquid electrolyte and wherein applying the electromagnetic radiation is configured to perform total polymerisation forming first and second areas in solid or gel form in the electrolyte.

12. Method for fabricating an electrochemical device according to claim 1, comprising applying the electromagnetic radiation only through the first electrode to at least partially polymerise the electrolyte.

13. Method for fabricating an electrochemical device according to claim 1, wherein applying the electromagnetic radiation comprises applying a first electromagnetic radiation through the first electrode to the electrolyte and applying a second electromagnetic radiation through the second electrode to the electrolyte.

14. Method for fabricating an electrochemical device according to claim 1, wherein applying the electromagnetic radiation comprises applying a first electromagnetic radiation through the first electrode to the electrolyte and applying a second electromagnetic radiation through the second electrode to the electrolyte, and wherein the first and second electromagnetic radiations are applied simultaneously.

15. Method for fabricating an electrochemical device according to claim 1, comprising a blocker connecting the first electrode with the second electrode, the blocker defining a reservoir for the electrolyte in association with the first electrode and second electrode before applying the electromagnetic radiation.

* * * * *